(12) United States Patent
Chen et al.

(10) Patent No.: US 7,468,326 B2
(45) Date of Patent: Dec. 23, 2008

(54) METHOD OF CLEANING A WAFER

(75) Inventors: Ming-Te Chen, Tai-Chung Hsien (TW); Yi-Ching Wu, Kao-Hsiung Hsien (TW); Chien-Tung Huang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 139 days.

(21) Appl. No.: 11/161,961

(22) Filed: Aug. 24, 2005

(65) Prior Publication Data
US 2007/0049042 A1 Mar. 1, 2007

(51) Int. Cl.
*H01L 21/30* (2006.01)

(52) U.S. Cl. .................. 438/758; 134/1.2; 134/1.3; 438/424; 438/710; 257/E21.279; 257/E21.546

(58) Field of Classification Search ............... 438/680, 438/758, 710, 424; 134/1.2, 1.3
See application file for complete search history.

(56) References Cited

U.S. PATENT DOCUMENTS

| 6,301,434 | B1 | 10/2001 | McDiarmid |
| 6,365,518 | B1 * | 4/2002 | Lee et al. ............... 438/687 |
| 2001/0054387 | A1 * | 12/2001 | Frankel et al. ............ 118/725 |
| 2006/0051967 | A1 * | 3/2006 | Chang et al. ............. 438/710 |

FOREIGN PATENT DOCUMENTS

CN 1506172 A 6/2004

* cited by examiner

Primary Examiner—Alexander G Ghyka
(74) Attorney, Agent, or Firm—Winston Hsu

(57) ABSTRACT

A wafer is provided and loaded in a reaction chamber. Subsequently, the wafer is lifted up, and a dry clean process is performed on the wafer to clean the front side, the back side, and the bevel of the wafer. Following that, a deposition process is performed on the wafer. The dry clean process and the deposition process are carried out in an in-situ manner.

8 Claims, 9 Drawing Sheets

METHOD OF CLEANING A WAFER

BACKGROUND OF THE INVENTION

1. Field of the Invention

The present invention pertains to a method of cleaning a wafer, and more particularly, to a method that is performed prior to a deposition process while the wafer is lifted. Consequently, particles adhered to the front side, the back side, and the bevel of the wafer can be effectively removed.

2. Description of the Prior Art

Normally, semiconductor fabrications are implemented by repeatedly performing deposition processes, photolithography processes, and etching processes. In each process, particles unavoidably appear on the wafer. For instance, a great deal of polymers tend to adhere to the surface of the wafer including the front side, the back side, and the bevel. If the polymers are not removed, they may become a particle source after being heated in the successive processes. This would affect the production yield and product reliability. In a deposition process, particularly, if polymers remain on the wafer, the adhesion between the thin film to be deposited and the wafer may be seriously affected. This leads to a film peeling issue, and influences the production yield.

Please refer to FIG. 1. FIG. 1 is a flow chart of a conventional deposition process. As shown in FIG. 1, the conventional deposition process includes:

Step 10: providing a wafer to be deposited;
Step 12: performing a clean process to the wafer; and
Step 14: performing a deposition process to the wafer.

Although the conventional deposition process includes a clean process, the clean process is performed while the wafer is positioned on an E-chuck of a deposition apparatus. Therefore, only the front side of the wafer is cleaned. The back side and the bevel of the wafer remain unclean.

Please refer to FIG. 2. FIG. 2 is a diagram schematically illustrating a clean process performed prior to a conventional deposition process. As shown in FIG. 2, a wafer 20 to be deposited is provided, and loaded into a deposition apparatus 30. The deposition apparatus 30 includes a reaction chamber 32, an E-chuck 34 disposed on the bottom of the reaction chamber 32 for supporting the wafer 20, a cooling system 36 disposed on the bottom of the reaction chamber 32, and a plurality of RF powers 38 disposed on the bottom, the top, and sidewalls of the reaction chamber 32 to provide different voltages through inductive coils 40 so as to generate plasma.

As shown in FIG. 2, the wafer 20 being cleaned is disposed on the E-chuck 34, and thus only the front side 22 of the wafer 20 is cleaned. Meanwhile, the particles adhered to the back side 24 and the bevel 26 of the wafer 20 still exist. In such a condition, the particles remaining on the back side 24 and the bevel 26 may affect the adhesion between the film to be deposited (not shown) and the wafer 20. The poor adhesion would cause a peeling issue due to heat effect in the following processes, and reduce the production yield.

SUMMARY OF THE INVENTION

It is therefore one of the objects of the claimed invention to provide a method of cleaning a wafer to effectively remove the particles adhered to the front side, the back side, and the bevel of the wafer.

It is another object of the claimed invention to provide a method of performing a deposition process to ensure the yield of the deposition process.

According to the claimed invention, a method of cleaning a wafer is disclosed. First, a wafer is provided, and loaded into a reaction chamber. Subsequently, the wafer is lifted, and a dry clean process is performed on the wafer. Following that, a deposition process is performed on the wafer. The dry clean process and the deposition process are performed in an in-situ manner.

According to the claimed invention, a method of performing a deposition process is also disclosed. First, a wafer is provided, and loaded into a reaction chamber. Subsequently, the wafer is lifted, and a dry clean process is performed to clean the front side, the back side, and the bevel of the wafer. Following that, a deposition process is performed on the wafer. The dry clean process and the deposition process are performed in an in-situ manner.

The dry clean process is performed while the wafer is lifted, and thus not only the front side of the wafer, but also the particles adhered to the back side and the bevel of the wafer are effectively removed. Therefore, the yield of a successive deposition process is guaranteed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
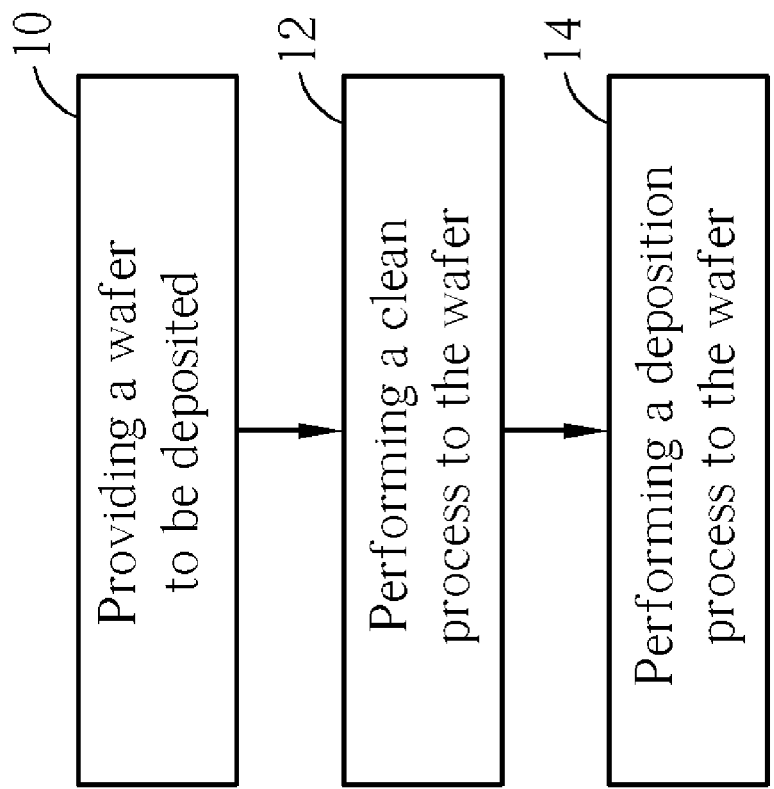
FIG. 1 is a flow chart of a conventional deposition process.
Figure 2:
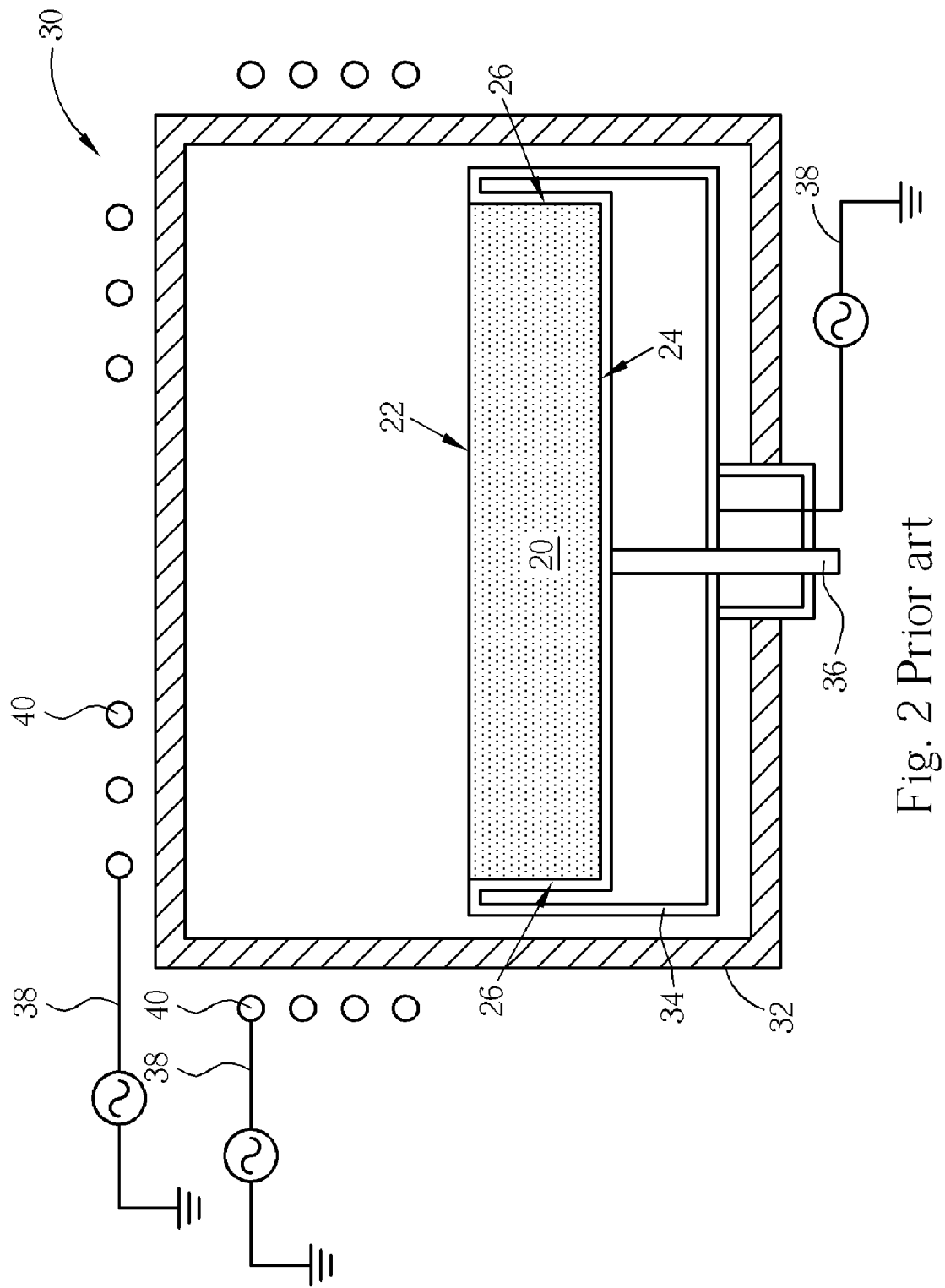
FIG. 2 is a diagram schematically illustrating a clean process performed prior to a conventional deposition process.
Figure 3:
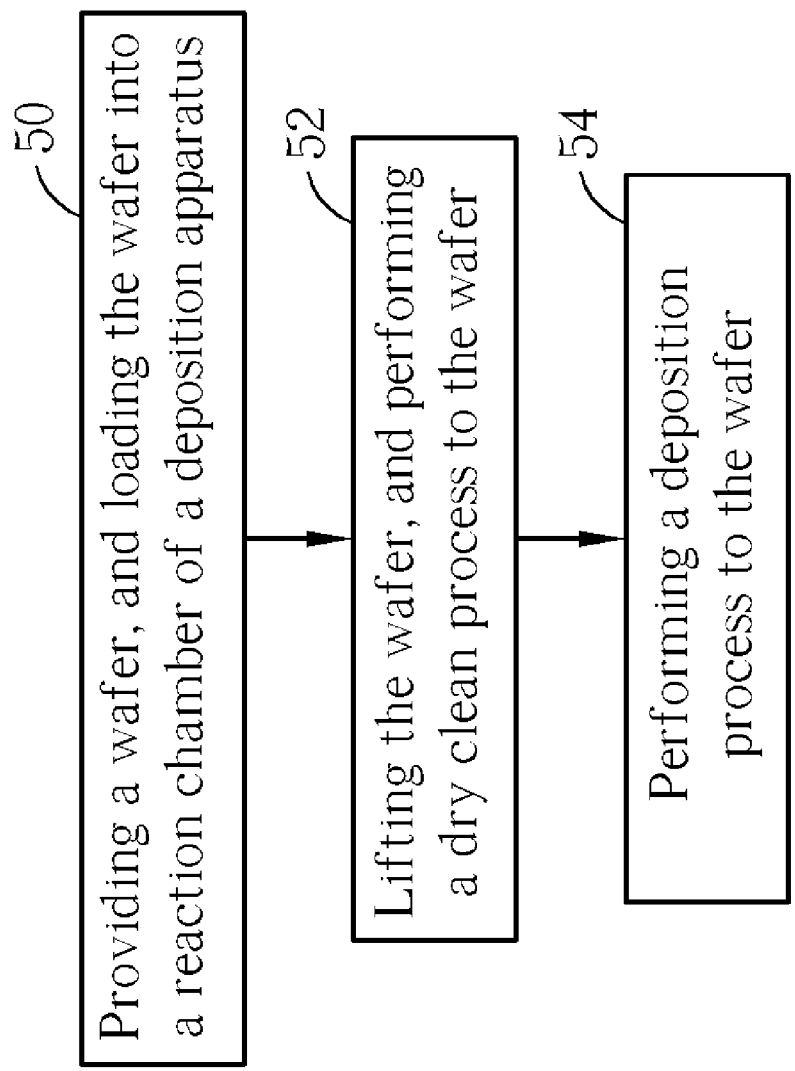
FIG. 3 is a flow chart of a method of cleaning a wafer according to a preferred embodiment of the present invention.

Please refer to FIG. 3. FIG. 3 is a flow chart of a method of cleaning a wafer according to a preferred embodiment of the present invention. As shown in FIG. 3, the method of cleaning a wafer according to the present invention includes:

Step 50: providing a wafer, and loading the wafer into a reaction chamber of a deposition apparatus;
Step 52: lifting the wafer, and performing a dry clean process to the wafer; and
Step 54: performing a deposition process to the wafer.

Figure 4:
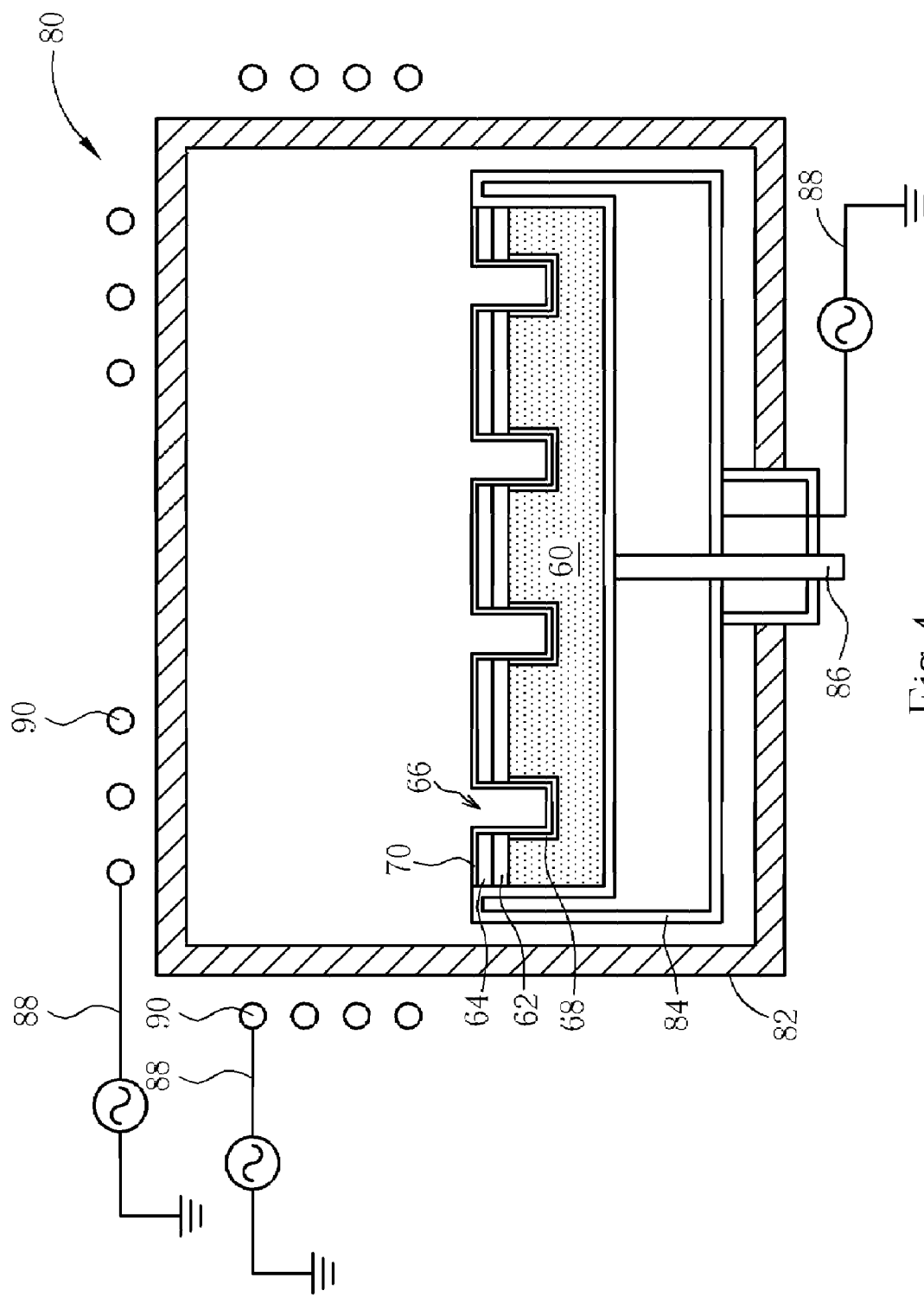
FIG. 4 through FIG. 6 are diagrams schematically illustrating a method of cleaning a wafer adopted in a shallow trench isolation (STI) filling process.
Figure 5:
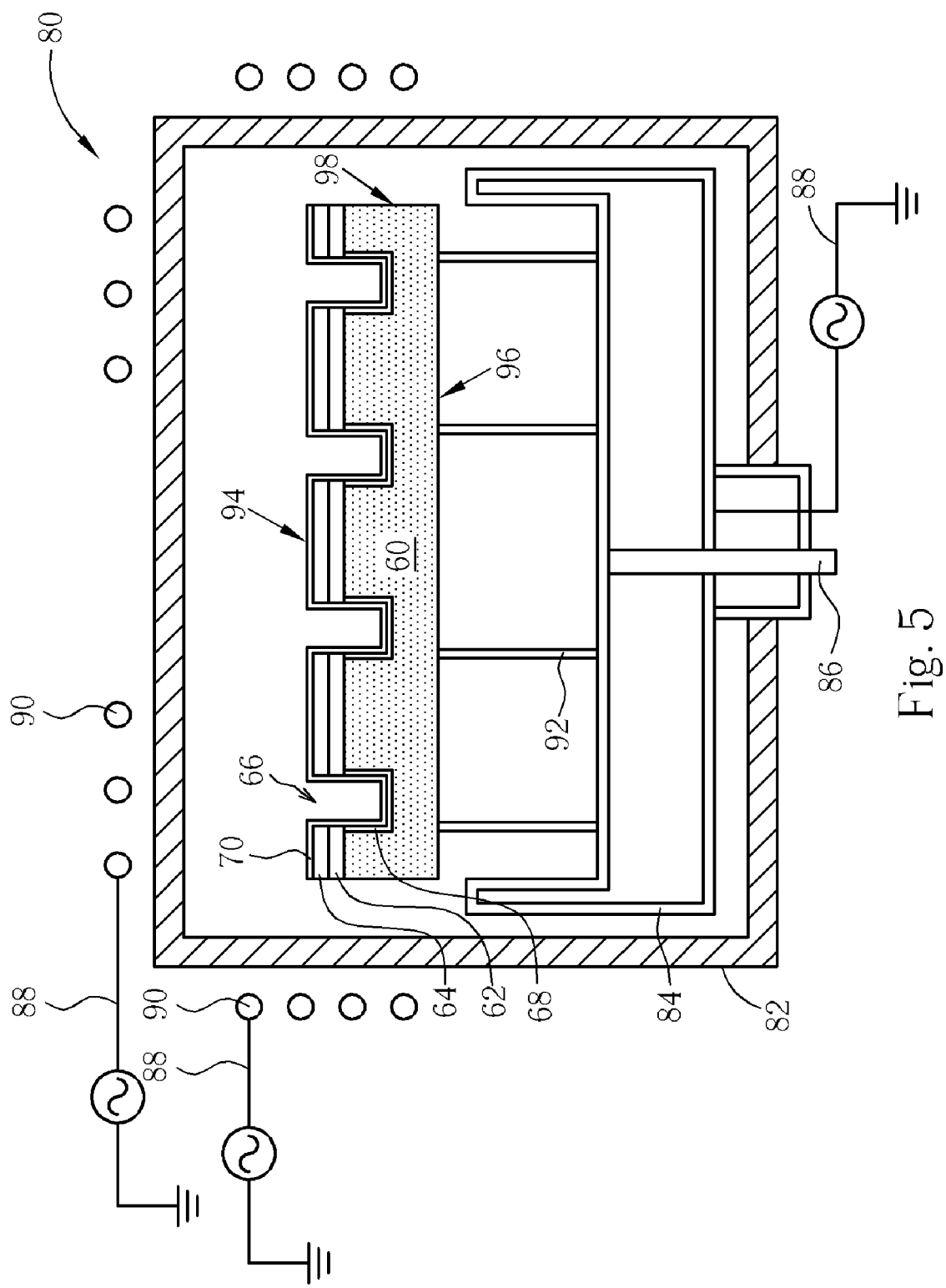
Figure 6:
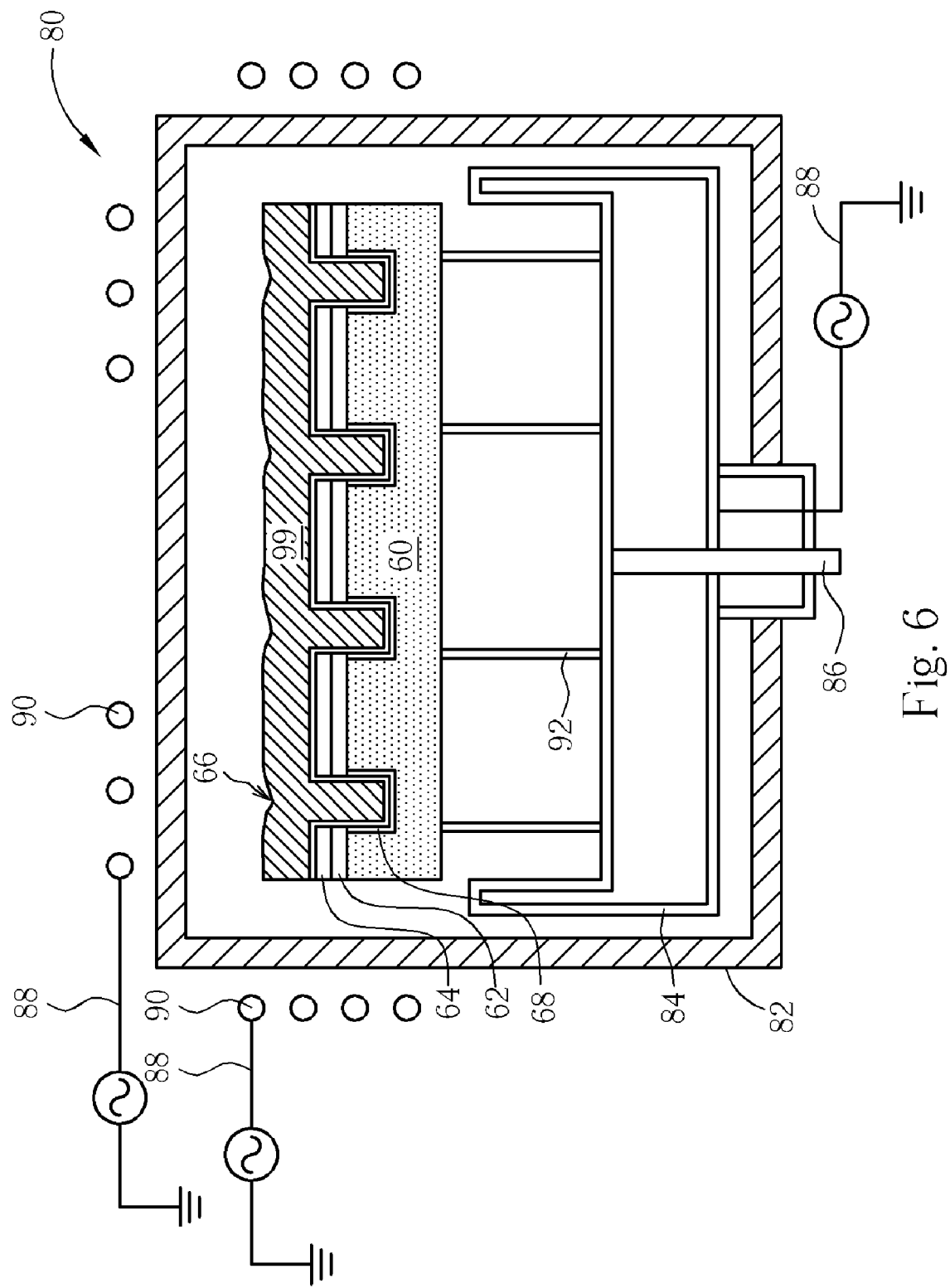

According to the present invention, a dry clean process is performed prior to the deposition process while the wafer is in a lifted condition. Consequently, the particles remaining on the front side, the back side, and the bevel of the wafer can be mainly removed. Please refer to FIG. 4 through FIG. 6. FIG. 4 through FIG. 6 are diagrams schematically illustrating a method of cleaning a wafer adopted in a shallow trench isolation (STI) filling process. As shown in FIG. 4, a wafer 60 to be deposited is provided. The wafer 60 includes a pad oxide layer 62 disposed on the wafer 60, a pad nitride layer 64 disposed on the pad oxide layer 62, and a plurality of shallow trenches 66. Each shallow trench 66 includes a liner oxide layer 68 and a liner nitride layer 70. The wafer 60 is then loaded into a deposition apparatus 80. In this embodiment, the STI filling process is carried out by a high density plasma chemical vapor deposition (HDPCVD) process, and therefore the deposition apparatus 80 is a HDPCVD apparatus. However, the deposition apparatus 80 is not limited to a HDPCVD apparatus, and can be other apparatus such as various chemical vapor deposition (CVD) apparatus, plasma enhanced chemical vapor deposition (PECVD) apparatus, or physical vapor deposition (PVD) apparatus as long as a different deposition process is adopted. The deposition apparatus 80 includes a reaction chamber 82, an E-chuck 84 disposed on the bottom of the reaction chamber 82 for supporting the wafer 60, a cooling system 86 disposed on the bottom of the reaction chamber 82 for cooling the wafer 60 and the reaction chamber 82 wherever necessary, and a plurality of RF powers 88 and inductive coils 90 disposed on the bottom, the top, and sidewalls of the reaction chamber 82 for exciting the gas in the reaction chamber 82 so as to generate plasma.

As shown in FIG. 5, a dry clean process is performed. First, the wafer 60 is lifted up with pins 92 equipped in the E-chuck 84 of the deposition apparatus 80, and gas is implanted into the reaction chamber 82. Meanwhile, different voltages are supplied by the RF powers 88, and applied to the reaction chamber 82 through the inductive coils 90. Consequently, plasma is generated to clean the wafer 60. It is noted that the dry clean process also works to preheat the wafer 60. The gas of the dry clean process can be selected from one or any combinations of oxygen, ozone, oxygen-containing gases such as dinitrogen monoxide (nitrous oxide), and inert gases such as argon. However, the gas of the dry clean process is not limited, and can be other gases if different kinds of particles are to be removed. In addition, the dry clean process is not limited to a plasma clean process. Other method such as directly implanting gas into the reaction chamber 82 in a high temperature can also be considered.

Since the wafer 60 is cleaned in a lifted condition, not only the front side 94 of the wafer 60 is cleaned, but also particles adhered to the back side 96 and the bevel 98 can be removed in the dry clean process. Consequently, the yield of the deposition process is ensured. As shown in FIG. 6, a deposition process is subsequently performed to deposit an oxide layer 99 on the front side 94 of the wafer 60 to fill the shallow trenches 66. The STI is formed after a chemical mechanical polishing (CMP) process for removing the oxide layer 99 outside the shallow trenches 66 is performed. The dry clean process and the deposition process are performed in an in-situ manner in a same reaction chamber 82. Also, the particles adhered to the front side 94, the back side 96, and the bevel 98 of the wafer 60 are completely cleaned up. Consequently, a good adhesion between the oxide layer 99 and the wafer 60 (specifically the liner nitride layer 70) prevents the peeling issue in the following processes. It is noted that the wafer 60 is also lifted up while performing the deposition process, however, the wafer 60 can also be lowered to any proper position when performing the deposition process. In addition, the aforementioned STI filling process is merely an example for demonstrating the method of cleaning a wafer of the present invention, but not a limitation to the present invention. For instance, the method of the present invention can be adopted to clean the wafer prior to any dielectric layer deposition process, such as nitride layer deposition process or oxynitride layer deposition process.

Figure 7:
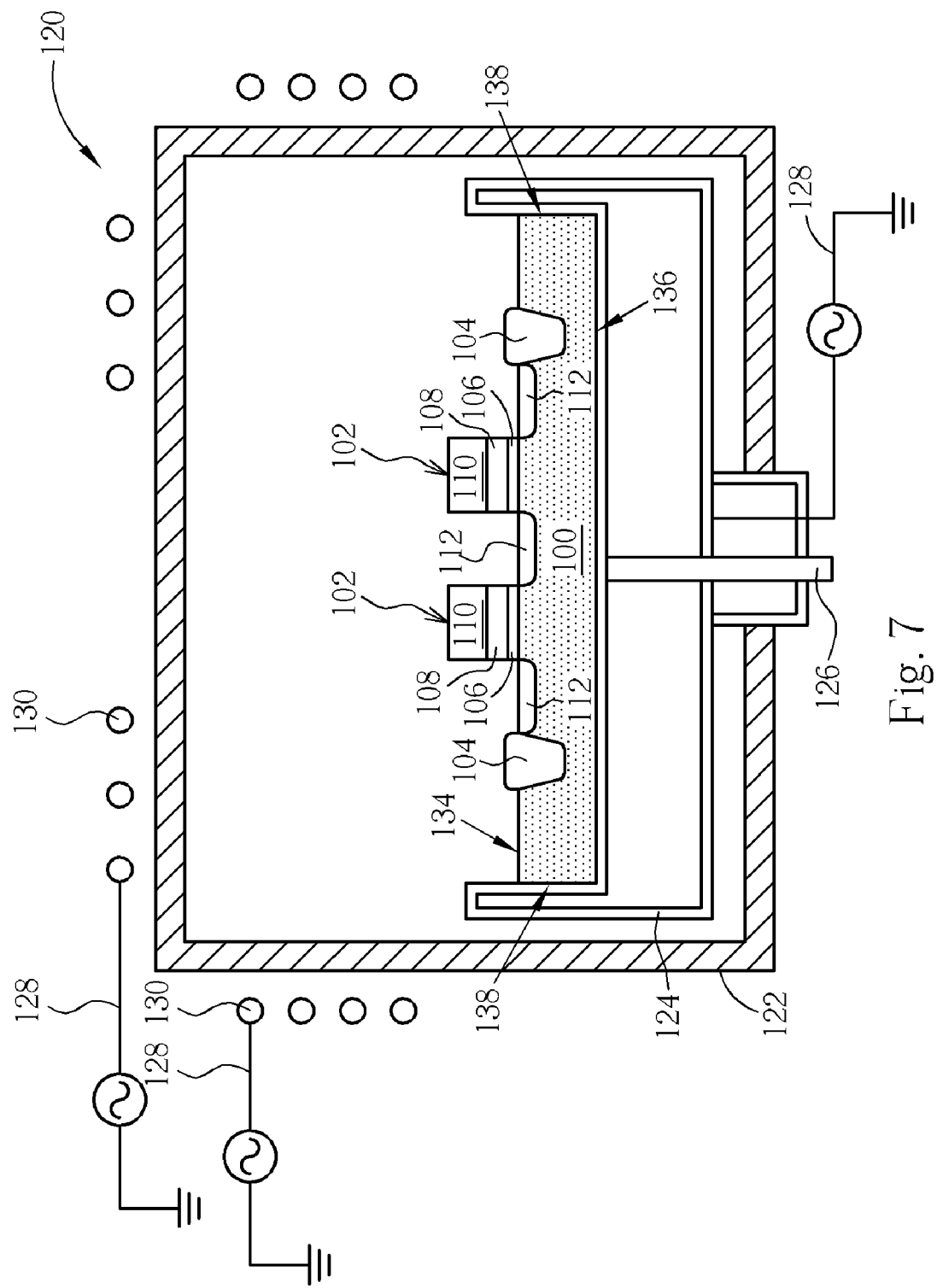
FIG. 7 through FIG. 9 are diagrams schematically illustrating a method of performing a deposition process according to another preferred embodiment of the present invention.
Figure 8:
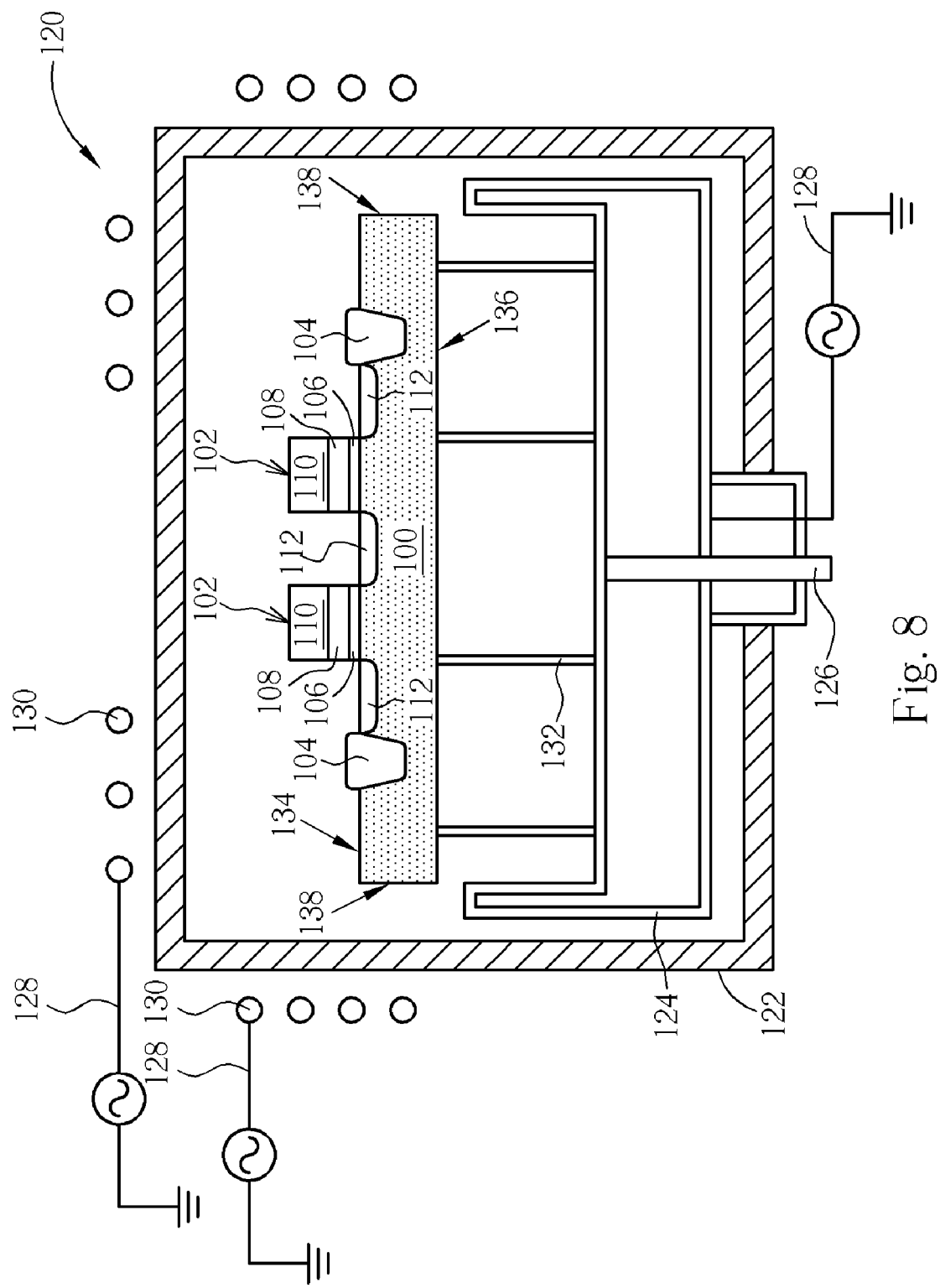
Figure 9:
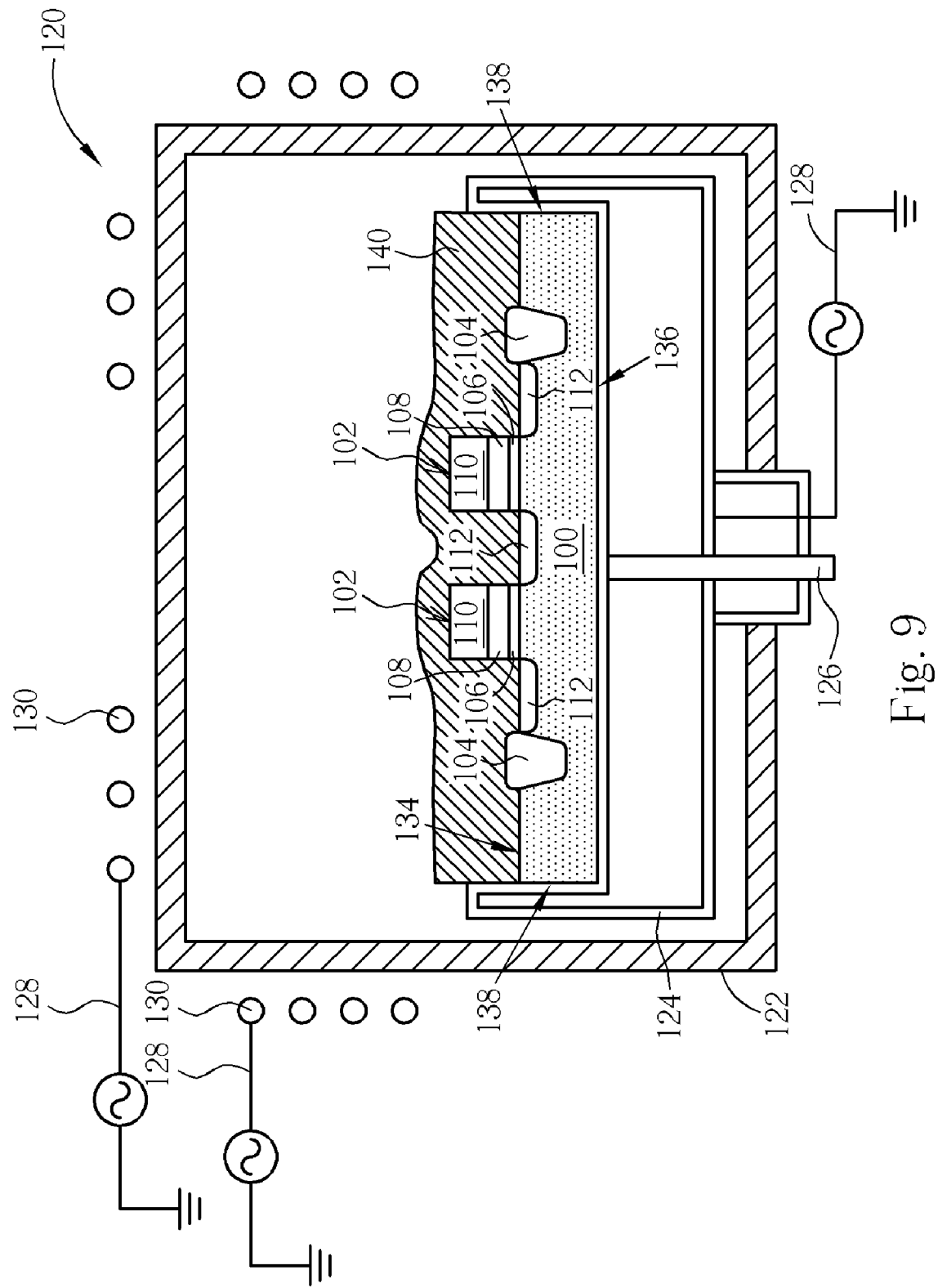

Please refer to FIG. 7 through FIG. 9. FIG. 7 through FIG. 9 are diagrams schematically illustrating a method of performing a deposition process according to another preferred embodiment of the present invention. In this embodiment, a dielectric layer deposition process of a stacked gate flash memory is exemplarily illustrated. However, the method of performing a deposition process of the present invention is not limited by this embodiment. As shown in FIG. 7, a wafer 100 is provided. The wafer 100 includes a plurality of stacked gates 102 isolated by field oxide layers 104. Each stacked gate 102 includes a gate dielectric layer 106, a polysilicon layer 108 disposed on the gate dielectric layer 106, and a cap layer 110 disposed on the polysilicon layer 108. In addition, the wafer 100 further includes a plurality of buried drains and sources 112. Subsequently, the wafer 100 is loaded into a deposition apparatus 120. In this embodiment, the deposition apparatus 120 is a HDPCVD apparatus. However, the deposition apparatus 120 is not limited to a HDPCVD apparatus, and can be other apparatus such as various chemical vapor deposition (CVD) apparatus, plasma enhanced chemical vapor deposition (PECVD) apparatus, or physical vapor deposition (PVD) apparatus as long as a different deposition process is adopted. The deposition apparatus 120 includes a reaction chamber 122, an E-chuck 124 disposed on the bottom of the reaction chamber 122 for supporting the wafer 100, a cooling system 126 disposed on the bottom of the reaction chamber 122 for cooling the wafer 100 and the reaction chamber 122 wherever necessary, and a plurality of RF powers 128 and inductive coils 130 disposed on the bottom, the top, and sidewalls of the reaction chamber 122 for exciting the gas in the reaction chamber 122 so as to generate plasma.

As shown in FIG. 8, a dry clean process is performed along with a preheat process. First, the wafer 100 is lifted up with pins 132 equipped in the E-chuck 124 of the deposition apparatus 120, and gas is implanted into the reaction chamber 122. In the meantime, different voltages are supplied by the RF powers 128, and applied to the reaction chamber 122 through the inductive coils 130. Consequently, plasma is generated to clean the wafer 100. The gas of the dry clean process can be selected from one or any combinations of oxygen, ozone, oxygen-containing gases such as dinitrogen monoxide (nitrous oxide), and inert gases such as argon. However, the gas of the dry clean process is not limited, and can be other suitable gases if different kinds of particles are to be removed. In addition, the voltages supplied by the RF powers 128 can be modified to achieve better clean and preheat effect.

Since the wafer 100 is cleaned in a lifted condition, not only the front side 134 of the wafer 100 is cleaned, but also particles adhered to the back side 136 and the bevel 138 can be removed in the dry clean process. Consequently, the yield of the successive deposition process is ensured. As shown in FIG. 9, the wafer 100 is lowered to the surface of the E-chuck 124, and a deposition process is performed to deposit a dielectric layer 140 on the front side 134 of the wafer 100 and the stacked gates 102. The dielectric layer 140 may be an oxide layer, a nitride layer, an oxynitride layer, or other dielectric materials.

The dry clean process and the deposition process are performed in an in-situ manner in a same reaction chamber 122. Also, the particles adhered to the front side 134, the back side 136, and the bevel 138 of the wafer 100 are completely cleaned up. Consequently, a good adhesion between the dielectric layer 140 and the wafer 100 is obtained, and this prevents the peeling issue in the following processes. It is noted that the wafer 100 is lowered down while performing the deposition process, however, the position of the wafer 100 can also be adjusted when performing the deposition process.

In comparison with the prior art, the method of cleaning a wafer according to the present invention lifts up the wafer when performing a dry clean process, e.g. a plasma clean process, so as to remove particles remaining on the front side, the back side, and the bevel of the wafer. Thus, the wafer is effectively cleaned. On the contrary, the conventional method of cleaning a wafer is carried out while the wafer is disposed on the surface of the E-chuck. As a result, particles adhered to the back side and bevel of the wafer cannot be removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a shallow trench isolation comprising:
   providing a wafer, wherein a pad oxide layer is disposed on the wafer, a pad nitride layer is disposed on the pad oxide layer, and a plurality of shallow trenches are in the wafer;
   loading the wafer on an E-chuck of a high density plasma chemical vapor deposition (HDPCVD) chamber;
   lifting the wafer by pins of the HDPCVD chamber, and performing a dry clean process upon the wafer when the wafer is lifted from the E-chuck; and
   performing a HDPCVD process upon the wafer when the wafer is on the E-chuck.

2. The method of claim 1, wherein the dry clean process is performed to clean a front side, a back side, and a bevel of the wafer.

3. The method of claim 1, wherein the dry clean process comprises a plasma clean process.

4. The method of claim 1, further comprising performing a preheat process along with the dry clean process.

5. The method of claim 1, wherein the HDPCVD process is performed to deposit at least a dielectric layer on the wafer.

6. The method of claim 5, wherein the dielectric layer comprises an oxide layer, a nitride layer, and an oxynitride layer.

7. The method of claim 3, further comprising implanting at least a gas into the reaction chamber while performing the plasma clean process.

8. The method of claim 7, wherein the gas is selected from the group consisting of oxygen, ozone, oxygen-containing gases, and inert gases.

* * * * *